United States Patent [15] 3,651,448
Pauza [45] Mar. 21, 1972

[54] POWER FRAME FOR INTEGRATED CIRCUIT

[72] Inventor: William Vito Pauza, Palmyra, Pa.
[73] Assignee: AMP Incorporated, Harrisburg, Pa.

[22] Filed: Mar. 20, 1970
[21] Appl. No.: 21,348

[52] U.S. Cl. ....................339/112 R, 317/234 A
[51] Int. Cl. ....................H01r 13/00
[58] Field of Search ....................339/112, 174; 29/589, 577, 29/576 S; 113/119; 317/234, 235

[56] References Cited

UNITED STATES PATENTS

| | | | |
|---|---|---|---|
| 3,484,533 | 12/1969 | Kauffman | 29/589 X |
| 3,423,516 | 1/1969 | Segerson | 174/52 |
| 3,440,027 | 4/1969 | Hugle | 113/119 X |
| 3,509,430 | 4/1970 | Mroz | 317/234 |

*Primary Examiner*—Richard E. Moore
*Attorney*—Curtis, Morris and Safford, William J. Keating, William Hintze, Adrian J. La Rue, Frederick W. Raring, Jay L. Seitchik and John P. Vandenburg

[57] ABSTRACT

This disclosure relates to power frames for mounting integrated circuits and, more particularly, to a metallic mounting member upon which a semiconductor device may be mounted and connected to form a completed device utilizing automatic equipment for assembly encapsulation, the mounting member including provision for efficient and rapid dissipation of heat produced in the semiconductor device.

4 Claims, 3 Drawing Figures

POWER FRAME FOR INTEGRATED CIRCUIT

This invention relates to lead frames for semiconductor devices and, more particularly, to a one-piece stamped and formed metallic mounting frame for semiconductor devices and particularly integrated circuits, capable of rapidly dissipating heat generated within the semiconductor element.

Lead frames for use with integrated circuits and semiconductors, in general, are well known in the art and devices of this type are exemplified by the patents to Lehner, U.S. Pat. No. 3,431,092 and Kauffman, U.S. Pat. No. 3,436,810. While lead frames of the type described in these patents have been readily accepted by the industry, and while these devices perform useful results, there is still a problem of heat dissipation from the semiconductor device which has been inadequately solved by the prior art lead frames.

In accordance with the present invention, there is provided a lead frame for use with semiconductors and particularly with integrated circuits wherein a lead frame is stamped out and formed in a manner to provide a heavy heat conductive mounting for the semiconductor, disposed below the terminal members of the frame, for supporting the semiconductor element thereon and for providing a substantial heat sink element when compared with prior art lead frames.

It is an object of this invention to provide a one-piece power lead frame having superior heat sink properties relative to prior art devices.

The above object of the invention will become apparent to those skilled in the art after consideration of the following preferred embodiments thereof, which are provided by way of example and not by way of limitation wherein.

Figure 1:
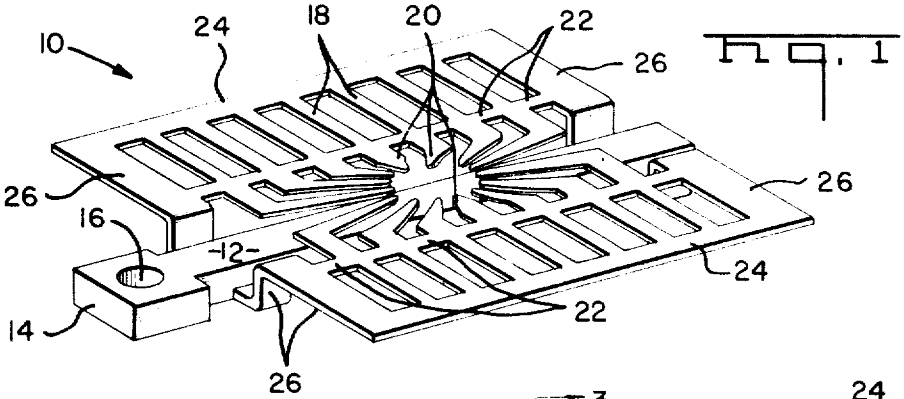
FIG. 1 is an elevational view of a completed lead frame in accordance with the present invention.
Figure 2:
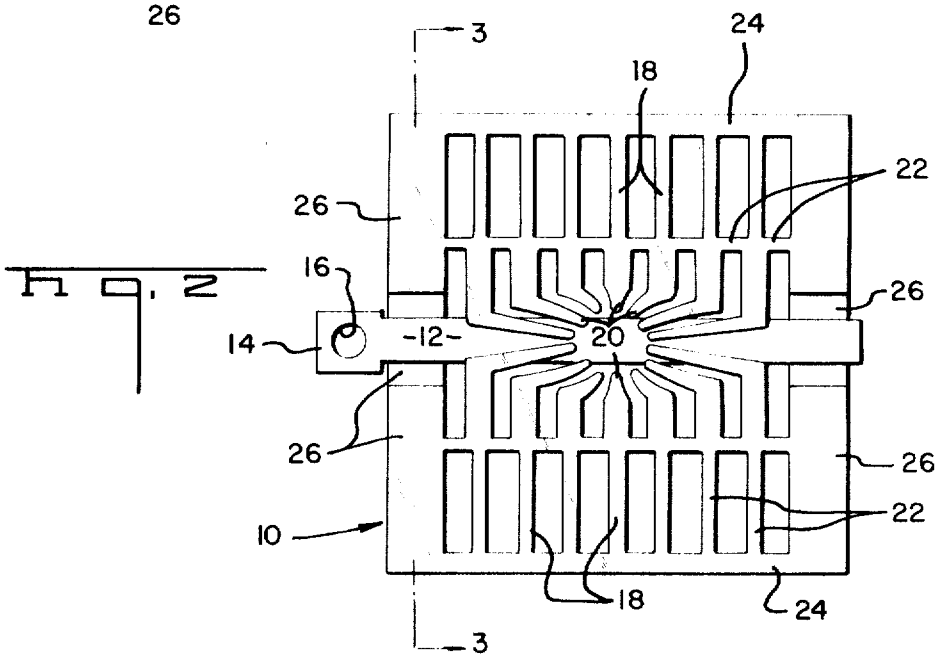
FIG. 2 is a top plan view of the frame shown in FIG. 1.

Referring to FIG. 1, there is shown a lead frame 10 representative of the invention. The frame may be manufactured from various electrically and conductive materials, such as copper, aluminum, and the like. Located centrally of the frame is a solid heat sink portion 12 extending the full length of the frame and having a mounting portion 14 including an aperture 16. Heat sink 12 is of a sufficient thickness and width to efficiently conduct heat away from a semiconductor device to be mounted thereon.

Figure 3:
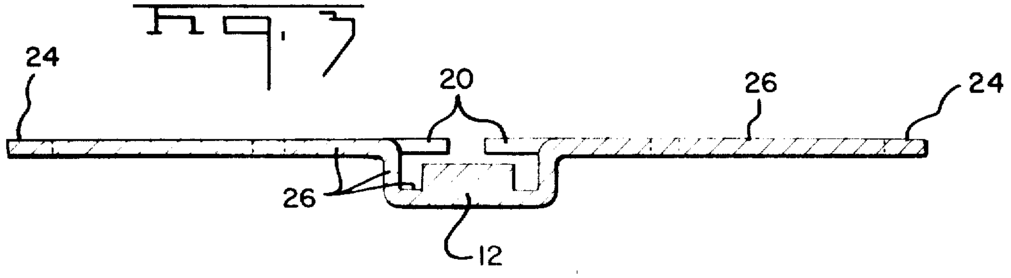
FIG. 3 is a cross-sectional view taken along the line 3—3 of FIG. 2.

Integral with the heat sink 12, leads 18 have end portions 20 which generally overlie or nearly overlie heat sink 12. Leads 18 are interconnected with heat sink 12 by tie sections 22, 24 and 26. Tie sections 22, 24 and 26, and leads 18, are substantially thinner in thickness as seen by the cross-sectional view shown in FIG. 3. The purpose of this differential thickness is, as pointed out above, the requirement that heat sink 12 be of a substantial thickness to efficiently conduct heat whereas such thickness is not desired for the leads.

In use, a semiconductor device is bonded to the heat sink in a manner allowing maximum heat transfer, after which the lead ends 20 are wire bonded to the semiconductor device. The assembly then goes through a conventional potting operation after which the various tie sections are trimmed away thereby electrically separating the leads 18 from each other and from the heat sink 12. Usually the leads are then bent downwardly 90° to facilitate plugging into a header system.

Various methods of fabricating a lead frame in accordance with the invention will be apparent to those skilled in the art. A preferred method is fully disclosed and claimed in my copending application Ser. No. 21,328 filed Mar. 20, 1970.

Although the invention has been described with respect to a specific preferred embodiment thereof, many variations and modifications thereof will immediately become apparent to those skilled in the art. It is therefore the intention that the appended claims be interpreted as broadly as possible to include all such variations and modifications.

What is claimed is:

1. A one-piece stamped and formed dual in-line lead frame comprising:
   - a first pair of parallel spaced-apart tie strips,
   - a plurality of leads integral with each of said first tie strips, said leads extending towards each other from said tie strips and having their inner ends centrally located in said frame, said leads and said first pair of tie strips lying in a single plane,
   - a second pair of tie strips extending transversely of, and between, said first pair of tie strips and enclosing said leads, said second pair of tie strips being integral with said first pair of tie strips in said single plane,
   - said second pair of tie strips being offset from said single plane intermediate their ends, and
   - a heat sink extending between said intermediate portions of said second tie strips in a plane which is spaced from said single plane, said heat sink extending beside said inner ends of said leads whereby, an integrated circuit device can be mounted on said heat sink intermediate the ends thereof and electrical connections can be made to said leads.

2. A stamped and formed lead frame as set forth in claim 1 wherein said tie strips and said leads are formed of sheet metal of the same thickness, said heat sink being formed of sheet metal which is substantially thicker than said tie strips and said leads.

3. A stamped and formed lead frame as set forth in claim 1 wherein said heat sink has an opening thereon which is adapted to receive a fastener for mounting said frame on a mounting surface.

4. A stamped and formed lead frame as set forth in claim 4 wherein said heat sink has a portion which extends beyond one of said second tie strips, said opening being in said portion.

* * * * *